(12) United States Patent
Nakazato et al.

(10) Patent No.: US 7,402,376 B2
(45) Date of Patent: Jul. 22, 2008

(54) PHOTOSENSITIVE RESIN COMPOSITION AND PHOTOSENSITIVE DRY FILM CONTAINING THE SAME

(75) Inventors: Syunji Nakazato, Kanagawa (JP); Ryuma Mizusawa, Kanagawa (JP); Hiroyuki Obiya, Kanagawa (JP); Takashi Ono, Kanagawa (JP); Yusuke Fujito, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 79 days.

(21) Appl. No.: 11/098,429

(22) Filed: Apr. 5, 2005

(65) Prior Publication Data

US 2005/0238998 A1 Oct. 27, 2005

(30) Foreign Application Priority Data

Apr. 26, 2004 (JP) ............................. 2004-129327

(51) Int. Cl.
*G03F 7/00* (2006.01)
*G03F 7/004* (2006.01)

(52) U.S. Cl. .................. 430/284.1; 430/270.1; 430/905; 430/913

(58) Field of Classification Search ............... 430/270.1, 430/905, 913, 271.1, 284.1
See application file for complete search history.

(56) References Cited

U.S. PATENT DOCUMENTS 6,818,382 B2 * 11/2004 Tamura et al. ........... 430/281.1

2002/0076652 A1 6/2002 Kumazawa et al.
2004/0009428 A1 * 1/2004 Tamura et al. ........... 430/280.1
2006/0041053 A1 * 2/2006 Kamata et al. ............ 524/556
2006/0079593 A1 * 4/2006 Kamata et al. ............ 522/39

FOREIGN PATENT DOCUMENTS

| EP | 1518672 A2 * | 3/2005 |
| JP | 01224747 A * | 9/1989 |
| JP | 05097962 A * | 4/1993 |
| JP | 08-054734 | 2/1996 |
| JP | 11-181042 | 7/1999 |
| KR | 2002-0035756 | 5/2002 |
| KR | 2003-0097780 | 12/2003 |
| WO | 03/005126 A1 | 1/2003 |

OTHER PUBLICATIONS

English language abstract of JP 5-97962.*
English language abstract of JP 01-224747A.*

* cited by examiner

*Primary Examiner*—Amanda C. Walke
(74) *Attorney, Agent, or Firm*—Wenderoth, Lind & Ponack, L.L.P.

(57) ABSTRACT

A photosensitive resin composition which gives a dry film having a sand blast proof property and a development property in a well-balanced manner. A photosensitive resin composition containing a carboxy group-containing urethane (meth)acrylate compound having two or more of (meth)acryloyl groups per molecule whose acid value of less than 10 mg KOH/g, an alkali soluble polymer compound, a photopolymerization initiator and a photopolymerizable compound (D) including in the structure thereof a structural unit represented by the formula (I) gives such a well-balanced properties.

—(OCH$_2$CH$_2$)— (I)

8 Claims, No Drawings

PHOTOSENSITIVE RESIN COMPOSITION AND PHOTOSENSITIVE DRY FILM CONTAINING THE SAME

CROSS-REFERENCE TO RELATED APPLICATIONS

The present application claims the benefit of priority based on the Japanese Patent Application No. 2004-129327 filed on Apr. 26, 2004, the entire disclosure of which is incorporated herein by reference.

BACKGROUND OF THE INVENTION

1) Field of the Invention

The present invention relates to a photosensitive resin composition and a photosensitive dry film containing the same, and in particular relates to a photosensitive resin composition from which an excellent development property as well as a resist pattern excellent in sand blast proof property are obtained when formed into the dry film.

2) Description of the Related Art

Conventionally, as a method for selectively engraving a material to be processed such as glass and ceramics, there has been known a method which is called a sand blast processing. In the sand blast processing, a patterned photosensitive resin layer is provided as a masking material on the material to be processed and subsequently an unmasked portion is selectively engraved by blasting an abrasive on this photosensitive resin layer. The sand blast processing has been utilized for formation of a rib (partition) which defines each cell in a plasma display, and pattern formation of a circuit substrate having both a metallic pattern and an insulating pattern of the ceramics and a phosphor.

A photosensitive dry film has been used for forming a masking material used for the sand blast processing. This photosensitive dry film is a film with three layer structure obtained by coating a photosensitive resin composition on a removable support film, half drying this coating film to form a photosensitive resin layer and laminating a removable protection film thereon. Upon the use thereof, the protection film is peeled off from the photosensitive resin layer, the uncovered photosensitive resin layer is overlaid on a material to be processed, and the photosensitive resin layer is press-bonded by adding the pressure via the support film. Subsequently, the resist pattern which is the masking material in the sand blast processing is formed by exposing the photosensitive resin layer to light through the support film, peeling the support film off, and subjecting the resin layer to a developing treatment.

In recent years, along with progress of photolithography and sand blast technique, rib formation with finer pattern has been desired in the plasma display.

Aiming at efficient production of such a fine rib pattern with a high process yield, there have been reported a variety of many photosensitive resin compositions containing a carboxy-modified urethane (meth)acrylate compound and a photopolymerization initiator. For example, Patent Document 1 (JP-H8-54734-A) discloses a photosensitive resin composition containing a carboxy-modified urethane (meth)acrylate with an acid value of 20 to 70 mg KOH/g, an alkali soluble polymer compound and a photopolymerization initiator.

Patent Document 2 (JP-H11-181042-A) discloses a photosensitive resin composition containing both a carboxyl group-containing acrylic urethane based resin having an acid value of 10 to 100 mg KOH/g and an acrylic urethane based resin having a certain segment moiety, in addition to a photopolymerization initiator.

SUMMARY OF THE INVENTION

The mask material for the sand blast processing is required to have a sufficient strength (sand blast proof property) so that the masking material is not worn away even when an abrasive is blasted for a predetermined time.

As to the above photosensitive resin composition containing the carboxy-modified urethane (meth)acrylate compound and the photopolymerization initiator, it has been found that the acid value of the carboxy-modified urethane (meth)acrylate compound is correlated with the sand blast proof property. The higher the acid value of the carboxy-modified urethane (meth)acrylate compound is, the more the sand blast proof property tends to be reduced.

Therefore, when the sand blast proof property is important, it is preferable that the content of the acid value of the carboxy-modified urethane (meth)acrylate compound in the photosensitive resin composition is kept as low as possible. However, lowering of the acid value of the carboxy-modified urethane (meth)acrylate compound may result in insufficient development of the unexposed portion, which may then lead to low resolution. With such a low resolution, a fine pattern can not be formed. Accordingly, in the conventional photosensitive resin composition, it has been necessary to use the carboxy-modified urethane (meth)acrylate compound whose acid value is at least 10 mg KOH/g or more.

It has been also known that the sand blast proof property can be enhanced by increasing a content of the carboxy-modified urethane (meth)acrylate compound in the photosensitive resin composition. However, in this case, a crosslinking density of the resulting resist pattern is decreased. Thus, it has been problematic in that the fine pattern at the development is sometimes tucked and the film is sometimes peeled. If the crosslinking density is increased by adding a photopolymerizable monomer excellent in curing property in order to address this problem, then the sand blast proof property is reduced, which may cause defect of the pattern upon the sand blast processing.

The present invention has been made in the light of the above, and it is an object of the present invention to provide a photosensitive resin composition which is excellent in both sand blast proof property and development property, and a photosensitive dry film having the advantage of this composition.

As a result of an intensive study for solving the above problems, the present inventors have found that a photosensitive resin composition which is excellent in both sand blast proof property and development property is obtained by using a carboxy-modified urethane (meth)acrylate compound (A) having two or more (meth)acryloyl groups per molecule whose acid value is less than 10 mg KOH/g, together with a photopolymerizable compound (D) containing a specific structural unit. The present inventors have thus completed the present invention based on this finding.

The photosensitive resin composition of the present invention is characterized by containing a carboxy-modified urethane (meth)acrylate compound (A) having two or more (meth)acryloyl groups per molecule whose acid value is less than 10 mg KOH/g, an alkali soluble polymer compound (B), a photopolymerization initiator (C) and a photopolymerizable compound (D) including in the structure thereof a structural unit represented by the following formula (I).

 (I)

Conventionally, in order to obtain the good development property, it has been necessary to use the carboxy-modified urethane (meth)acrylate compound whose acid value is 10 mg KOH/g or more, and thus the sand blast proof property in the dry film has not been always sufficient. On the contrary, according to the present invention, the good development property may be kept even when using the carboxy-modified urethane (meth)acrylate compound whose acid value is less than 10 mg KOH/g, by the use of the photopolymerizable compound (D) including the structural unit represented by the formula (I) in the structure. Thereby it is possible to obtain the photosensitive resin composition having the well-balanced sand blast proof property and development property.

The photosensitive dry film of the present invention has a photosensitive resin composition layer formed from the photosensitive resin composition of the present invention between a support film and a protection film. Upon use thereof, a photosensitive resin layer may be easily provided on a material to be processed by peeling the protection film off from the photosensitive resin layer, overlaying the uncovered photosensitive resin layer on the material to be processed and subsequently peeling the support film off from the photosensitive resin layer.

By the photosensitive resin composition of the present invention, the photosensitive resin layer which is excellent in both sand blast proof property and development property may be formed. The photosensitive resin layer formed by the use of the photosensitive resin composition of the present invention may be suitably used as a masking material used for the sand blast processing because the layer is excellent in both sand blast proof property and development property.

The photosensitive dry film of the present invention is easily stored, transported and handled because both faces thereof are protected with removable films capable of being easily peeled off.

The photosensitive dry film may be prepared and stored in a given period of time although the film has an expiration date. Therefore, the film may be ready-to-use for the sand blast processing, and a sand blast processing step may be efficiently promoted.

The other objects, features and advantages of the present invention are specifically set forth in or will become apparent from the following detailed descriptions of the invention.

DETAILED DESCRIPTIONS

Embodiments of the present invention will be illustrated below in the following order.

[I] Photosensitive Resin Composition
(A) Carboxy-modified urethane (meth)acrylate compound
(B) Alkali soluble polymer compound
(C) Photopolymerization initiator
(D) Photopolymerizable compound including a specific structural unit
(E) Other photopolymerizable monomer
(F) Other ingredients
(G) Ratio of ingredients

[II] Photosensitive Dry Film

[I] Photosensitive Resin Composition

The photosensitive resin composition of the present invention contains a carboxy-modified urethane (meth)acrylate compound having two or more (meth)acryloyl groups per molecule whose acid value is less than 10 mg KOH/g, an alkali soluble polymer compound, a photopolymerization initiator and a photopolymerizable compound including a specific structural unit in the structure thereof.

(A) Carboxy-modified Urethane (meth)acrylate Compound

The carboxy-modified urethane (meth)acrylate compound used for the photosensitive resin composition of the present invention may be obtained by first reacting a polyisocyanate compound with a diol compound having a carboxyl group so that —NCO groups (isocyanate groups) remain at both ends thereof, and then reacting the terminal —NCO groups of this reaction product with a (meth)acrylate compound having a hydroxyl group. An excessive amount of the polyisocyanate compound is reacted with the diol compound to leave the —NCO groups at the both ends of the reaction product.

Specifically, the carboxy-modified urethane (meth)acrylate compound may be prepared by the following procedures: The polyisocyanate compound and the diol compound having the carboxyl group are placed in a round bottomed flask equipped with a cooler and a stirrer. Then a solvent such as dioxane and a catalyst are added thereto. The mixture is heated and stirred for 2 to 15 hours. Then the (meth)acrylate compound having the hydroxyl group, such as 2-hydroxyethylacrylate and 2-hydroxyethylmethacrylate, and a polymerization inhibitor such as hydroquinone are added thereto. The mixture is further heated and stirred for 1 to 8 hours to yield the objective compound. When the polyisocyanate compound is reacted with the diol compound having the carboxyl group, the reaction may be performed by further adding a dicarboxylic acid compound and the diol compound having no carboxyl group. The addition of the dicarboxylic acid compound may form an ester bond to increase a strength and enhance the sand blast proof property.

Examples of the polyisocyanate compounds may include hexamethylene diisocyanate, heptamethylene diisocyanate, 2,2-dimethylpentane-1,5-diisocyanate, octamethylene diisocyanate, 2,5-dimethylhexane-1,6-diisocyanate, 2,2,4-trimethylpentane-1,5-diisocyanate, nonamethylene diisocyanate, 2,2,4-trimethylhexane diisocyanate, 2,4,4-trimethylhexane diisocyanate, decamethylene diisocyanate, undecamethylene diisocyanate, dodecamethylene diisocyanate, tridecamethylene diisocyanate, pentadecamethylene diisocyanate, hexadecamethylene diisocyanate, butene diisocyanate, 1,3-butadiene-1,4-diisocyanate, 2-butynylene diisocyanate, 2,4-trilene diisocyanate, isophorone diisocyanate, 1,3-xylylene diisocyanate, 1,4-xylylene diisocyanate, and the like. They are preferably used in terms of giving an excellent sand blast proof property.

Example of the diol compound having the carboxyl group may include tartaric acid, 2,4-dihydroxybenzoic acid, 3,5-dihydroxybenzoic acid, 2,2-bis(hydroxymethyl)propionic acid, 2,2-bis(hydroxyethyl)propionic acid, 2,2-bis(3-hydroxypropyl)propionic acid, dihydroxymethylacetic acid, bis(4-hydroxyphenyl)acetic acid, 4,4-bis(4-hydroxyphenyl)pentanoic acid, homogentisic acid, and the like.

Among them, 2,2-bis(hydroxymethyl)propionic acid, 2,2-bis(hydroxyethyl)propionic acid and 2,2-bis(3-hydroxypropyl)propionic acid are suitable because they well-react with the polyisocyanate compound and the carboxy-modified urethane (meth)acrylate compound obtained by the reaction thereof has good solubility in an alkali solution. In particular, 2,2-bis(hydroxymethyl)propionic acid is preferable.

Examples of the dicarboxylic acid compounds may include oxalic acid, malonic acid, succinic acid, malic acid, itaconic acid, maleic acid, fumaric acid, glutaric acid, adipic acid, muconic acid, galactaric acid, pimelic acid, suberic acid, azelaic acid, sebacylic acid, undecanedioic acid, 1,1-cyclopropanedicarboxylic acid, 1,2-cyclopropanedicarboxylic acid, 1,1-cyclobutanedicarboxylic acid, 1,2-cyclobutanedicarboxylic acid, 1,1-cyclopentanedicarboxylic acid, 1,2-cyclopentanedicarboxylic acid, 1,3-cyclopentanedicarboxylic acid, 1,1-cyclohexanedicarboxylic acid, 1,2-cyclohexanedicarboxylic acid, 1,3-cyclohexanedicarboxylic acid, 1,4-cyclohexanedicarboxylic acid, phthalic acid, isophthalic acid, terephthalic acid, 2,3-biphenyldicarboxylic acid, 2,3'-biphenyldicarboxylic acid, 3,3'-biphenyldicarboxylic acid, 3,4'-biphenyldicarboxylic acid, 4,4'-biphenyldicarboxylic acid, 2,2'-methylenedibenzoic acid, 2,3'-methylenedibenzoic acid, 3,3'-methylenedibenzoic acid, 3,4'-methylenedibenzoic acid, 4,4'-methylenedibenzoic acid, 4,4'-isopropylidenedibenzoic acid, 3-carboxycinnamic acid, 4-carboxycinnamic acid, 3,3'-phenylenediacrylic acid, 3-oxyadipic acid, and the like. As described above, the addition of the dicarboxylic acid compound may form an ester bond to increase the strength and enhance the sand blast proof property.

Examples of the diol compound having no carboxyl group may include ethylene glycol, propylene glycol, butanediol, diethylene glycol, triethylene glycol, tetraethylene glycol, dipropylene glycol, neopentylglycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexane dimethanol, tricyclodecane dimethanol, hydrogenated bisphenol A, hydrogenated bisphenol F, hydrogenated bisphenol S, paraxylylene glycol, and the like.

As described above, the carboxy-modified urethane (meth) acrylate compound of the present invention may be synthesized by reacting the (meth)acrylate compound having the hydroxyl group with the isocyanate groups at the ends of the aforementioned molecule.

Examples of the (meth)acrylate compound having the hydroxyl group may include monomers having the hydroxyl group, such as hydroxymethyl acrylate, hydroxymethyl methacrylate, 2-hydroxyethyl acrylate, 2-hydroxyethyl methacrylate, 3-hydroxypropyl acrylate, 3-hydroxypropyl methacrylate, ethyleneglycol monomethyl acrylate, ethyleneglycol monomethyl methacrylate, ethyleneglycol monoethyl acrylate, ethyleneglycol monoethyl methacrylate, glycerol acrylate, glycerol methacrylate, dipentaerythritol monohydroxymethacrylate and dipentaerythritol monohydroxyacrylate.

Reaction of this (meth)acrylate compound having the hydroxyl group may react with the terminal —NCO group of the molecule as described above, to give the carboxy-modified urethane (meth)acrylate compound having modified double bonds at the ends thereof.

An acid value of the carboxy-modified urethane (meth) acrylate compound finally synthesized in the present invention is less than 10 mg KOH/g, and more preferably 3 to 5 mg KOH/g. The acid value more than 10 mg KOH/g is not preferable because the sand blast proof property becomes poor.

A glass transition point of the above carboxy-modified urethane (meth)acrylate compound after being cured is preferably −50° C. to 50° C., and more preferably −30° C. to 30° C. The glass transition point of less than −50° C. is not preferable because such a photosensitive resin composition tends to have an insufficient coating property, which leads to an insufficient sand blast proof property. The glass transition point of more than 50° C. is not either preferable because a flexibility of the resulting photosensitive resin tends to have an insufficient flexibility after being cured, which also leads to an insufficient sand blast proof property.

An average molecular weight of the carboxy-modified urethane (meth)acrylate compound after the synthesis is in the range of 1,000 to 50,000, and in particular preferably in the range of 2,000 to 30,000. The average molecular weight of less than 1,000 is not preferable because the binding force of the resulting coating layer after being cured becomes poor, which leads to an insufficient sand blast proof property. The average molecular weight of more than 50,000 also is not preferable because the coating property of the resulting layer becomes poor.

(B) Alkali Soluble Polymer Compound

For the alkali soluble polymer compound contained in the photosensitive resin composition of the present invention, a copolymer of (meth)acrylic acid and (meth)acrylate ester, and carboxyl group-containing cellulose are suitable.

This copolymer of (meth)acrylic acid and (meth)acrylate ester is a copolymer of at least one selected from acrylic acid, methacrylic acid, fumaric acid, maleic acid, crotonic acid, cinnamic acid, monomethyl fumarate, monoethyl fumarate, monopropyl fumarate, monomethyl maleate, monoethyl maleate, monopropyl maleate and sorbic acid and the like, and at least one selected from 2-hydroxymethyl acrylate, 2-hydroxymethyl methacrylate, 2-hydroxyethyl acrylate, 2-hydroxyethyl methacrylate, 2-hydroxypropyl acrylate, 2-hydroxypropyl methacrylate, ethyleneglycol monomethylether acrylate, ethyleneglycol monomethylether methacrylate, ethyleneglycol monoethylether acrylate, ethyleneglycol monoethylether methacrylate, glycerol acrylate, glycerol methacrylate, dipentaerythritol pentamethacrylate, dipentaerythritol pentaacrylate, acryl dimethylaminoethyl ester, methacryl dimethylaminoethyl ester, tetrahydrofurfuryl acrylate, tetrahydrofurfuryl methacrylate, acrylamide, methacrylamide, acrylonitrile, methacrylonitrile, methyl acrylate, methyl methacrylate, ethyl acrylate, ethyl methacrylate, butyl acrylate, butyl methacrylate, isobutyl acrylate, isobutyl methacrylate, 2-ethylhexyl acrylate, 2-ethylhexyl methacrylate, benzyl acrylate, benzyl methacrylate, carbitol acrylate, carbitol methacrylate, ε-caprolactone-modified tetrafurfuryl acrylate, ε-caprolactone-modified tetrafurfuryl methacrylate, diethyleneglycol ethoxyl acrylate, isodecyl acrylate, isodecyl methacrylate, octyl acrylate, octyl methacrylate, lauryl acrylate, lauryl methacrylate, tridecyl acrylate, tridecyl methacrylate, stearyl acrylate and stearyl methacrylate, and the like.

Polymerization of these multiple monomers may be random polymerization, block polymerization or graft polymerization.

Preferable examples of monomer combinations may include the combinations of acrylic acid or methacrylic acid with methyl acrylate, methyl methacrylate, ethyl acrylate or ethyl methacrylate. In particular, preferably-n-butyl acrylate or n-butyl methacrylate/acrylonitrile or methacrylonitrile are further combined in addition to the aforementioned combinations.

As carboxy group-containing cellulose, hydroxyethyl carboxymethylcellulose and cellulose acetate phthalate are suitable. Among them, cellulose acetate phthalate is suitably used because it is well compatible with the carboxy-modified urethane (meth)acrylate compound, is excellent in coating formability and is well-developed in an alkali solution when formed into the dry film.

The acid value of such an alkali soluble polymer compound may be 10 to 250 mg KOH/g, and preferably 80 to 200 mg KOH/g. When this acid value is less than 10 mg KOH/g, insufficient development sometimes occurs whereas when it is more than 250 mg KOH/g, flexibility and water proof property become poor, which are not preferable.

(C) Photopolymerization Initiator

Examples of the photopolymerization initiator may include those known publicly such as at least one selected from anthraquinone derivatives such as 2-methylanthraquinone, benzophenone derivatives such as 3,3-dimethyl-4-methoxy-benzophenone, acetophenone derivatives such as 2,2-dimethoxy-2-phenylacetophenone and 2-methyl-1-[4-(methylthio)phenyl]-2-morpholino-1-propanone, benzoin alkyl ether derivatives such as benzoin propyl ether, thioxanthone derivatives such as diethyl thioxanthone, Michler's ketone, 2-(o-chlorophenyl)-4,5-diphenylimidazolyl dimer, 9-phenylacridine, dimethylbenzylketal, trimethylbenzoyldiphenyl phosphine oxide, tribromomethylphenyl sulfone, 2-benzyl-2-dimethylamino-1-(4-morpholinophenyl)-butane-1-one, 2,4,6-trimethylbenzoyldiphenyl phosphine oxide, and the like.

(D) Photopolymerizable Compound Containing Specific Structural Unit

The photopolymerizable compound contained in the photosensitive resin composition of the present invention contains the structural unit represented by the following formula (I) in the structure thereof, and has an effect to inhibit lowering of a development property of the carboxy-modified urethane (meth)acrylate compound having low acid value. The photopolymerizable compound also has an effect to enhance a crosslinking density of a resist after the exposure of light while inhibiting the reduction of the sand blast proof property.

(I)

It is preferable that the photopolymerizable compound used for the present invention contains the structural units represented by the formula (I) in the range of 10 to 40 per molecule. When the number of the structural units represented by the formula (I) contained per molecule is less than 10, it is not preferable because the sand blast proof property may be largely reduced and defect of the resist pattern may occur upon the sand blast processing. On the other hand, when the number of the structural units represented by the formula (I) contained per molecule is more than 40, it is not preferable because the curing property may be reduced, and a fine pattern of the layer may be tucked or peeled off at the development.

The photopolymerizable compound containing the structural units represented by the formula (I) in the structure has polymerizable substituents at molecular ends thereof. Each of the polymerizable substituents at the molecular ends of the photopolymerizable compound is preferably an ethylenic unsaturated group, and in particular an acrylate group or a methacrylate group is preferable.

As the photopolymerizable compound containing the structural units represented by the formula (I) in the structure, for example, compounds represented by the following general formulae (I-1) and (I-2) may be exemplified.

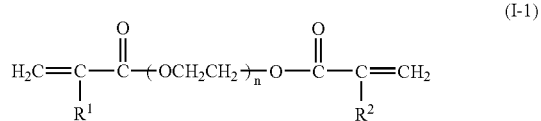
(I-1)

In the general formula (I-1), $R^1$ and $R^2$ each independently represent H or a methyl group, and n is an integer of 10 to 40.

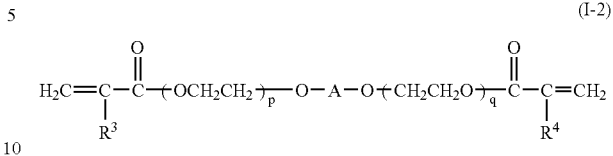
(I-2)

In the general formula (I-2), $R^3$ and $R^4$ each independently represent H or a methyl group. A represents an aliphatic hydrocarbon group having 1 to 20 carbon atoms, an alicyclic hydrocarbon group having 3 to 20 carbon atoms, an aromatic hydrocarbon group having 6 to 20 carbon atoms, or a hydrocarbon group binding two or more of these substituents, and p and q are positive integers selected so that p+q is 10 to 40.

Examples of the photopolymerizable compound suitably used for the present invention may include 2,2-bis[4-(methacryloxypolyethoxy)phenyl]propane, polyethylene glycol diacrylate, polyethylene glycol tetramethylene glycol diacrylate, and ECH-modified polyethylene glycol diacrylate where the number of the structural units represented by the formula (I) contained per molecule is in the range of 10 to 40. These may be used alone or in combination of two or more.

(E) Other Photopolymerizable Monomer

In addition to the photopolymerizable compound containing the structural units represented by the formula (I) in the structure, the present composition may further contain another photopolymerizable monomer for improving an exposed light sensitivity, and for preventing a film loss and swelling at the development.

As the other photopolymerizable monomer, the aforementioned (meth)acrylate ester, ethylenic unsaturated carboxylic acid, and monomers exemplified as the other copolymerizable monomer may be used. However, a more preferable example may be a monomer having two or more polymerizable ethylenic unsaturated bonds (referred to hereinbelow as a multifunctional monomer). Examples of the multifunctional monomers may include diacrylates and dimethacrylates of alkylene glycol such as ethyleneglycol and propyleneglycol, polyacrylates or polymethacrylates of trivalent polyalcohol such as glycerine, trimethylolpropane, pentaerythritol and dipentaerythritol, and dicarboxylic acid modified products thereof. Specifically, the examples thereof may include ethyleneglycol diacrylate, ethyleneglycol dimethacrylate, trimethylolpropane trimethacrylate, tetramethylolpropane tetraacrylate, tetramethylolpropane tetramethacrylate, pentaerythritol triacrylate, pentaerythritol trimethacrylate, pentaerythritol tetraacrylate, pentaerythritol tetramethacrylate, dipentaerythritol pentamethacrylate, dipentaerythritol hexaacrylate, dipentaerythritol hexamethacrylate, and the like.

(F) Other Ingredients

If necessary, the present composition may further contain an organic solvent for dilution such as alcohols, ketones, acetate esters, glycol ethers, glycol ether esters and petroleum based solvents for the purpose of viscosity control in addition to the above ingredients.

Specific examples may include, but are not limited to, hexane, heptane, octane, nonane, decane, benzene, toluene, xylene, benzyl alcohol, methyl ethyl ketone, acetone, methyl isobutyl ketone, cyclohexanone, methanol, ethanol, propanol, butanol, hexanol, cyclohexanol, ethylene glycol, diethylene glycol, glycerine, ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, methyl lactate, ethyl lactate, methyl acetate, ethyl acetate, propyl acetate, butyl acetate, propylene glycol monomethyl ether acetate, propylene glycol monoethyl ether acetate, methyl propionate, ethyl propionate, methyl benzoate, ethyl benzoate, propyl benzoate, butyl benzoate, methyl butyrate, ethyl butyrate, and propyl butyrate, as well as petroleum based solvents which are available under the product names of "Swazol" (supplied from Maruzen Petrochemical Co., Ltd.) and "Solvets" (supplied from Tonen Corporation).

Additionally, the present composition may optionally contain additives such as a coloring dye, an adhesive imparting agent, a plasticizer, an anti-oxidant, a heat polymerization inhibitor, a surface tension modifier, a stabilizer, a chain transfer agent, an anti-foaming agent and a flame retardant.

(G) Ratio of Ingredients

The weight ratio of the content of the carboxy-modified urethane (meth)acrylate compound to the alkali soluble polymer compound is in the range 1:19 to 19:1, and more preferably in the range of 5:15 to 18:2. When the weight of the carboxy-modified urethane (meth)acrylate compound is less than 1/19 parts by weight based on 1 part by weight of the alkali soluble polymer compound, it is not preferable because the sand blast proof property may be reduced. When the weight of the carboxy-modified urethane (meth)acrylate compound is more than 19 parts by weight, it is not either preferable because a film formation ability may become poor to cause a drawback such as cold flow when formed into the film.

It is preferable that the content of the photopolymerization initiator in the present composition is in the range of 0.1 to 20 parts by weight per 100 parts by weight of a photosensitive resin solid content.

It is preferable that the content of the photopolymerizable compound having the structural units represented by the formula (I) in the structure is in the range of 10 to 200 parts by weight per 100 parts by weight of the carboxy-modified urethane (meth)acrylate compound. When the ratio of the photopolymerizable compound is less than 10 parts by weight, disadvantageous defects may occur in the development process. When the ratio of the photopolymerizable compound is more than 200 parts by weight, hydrophilicity may be increased and development margin may be disadvantageously reduced.

It is preferable that the content of the optional other photopolymerizable monomer is in the range of less than 100 parts by weight based on 100 parts by weight of the carboxy-modified urethane (meth)acrylate compound. When the ratio is more than 100 parts by weight, the cold flow may easily occur as well as the sand blast proof property may disadvantageously be reduced due to decreased elasticity of the photosensitive resin composition after being cured by ultraviolet irradiation.

The photosensitive resin composition of the present invention may be used for any of the method of coating the material to be processed with a liquid composition to form the photosensitive resin layer, the method of forming the photosensitive resin layer by screen printing, and the method of previously forming and drying the photosensitive resin layer on a flexible film and then attaching this film (photosensitive dry film) on the material to be processed (dry film method), depending on its intended use. By the use of these methods, when accurate alignment of electronic parts is required, a resin pattern can be formed at an accurate position to realize the engraving with high accuracy because it is not necessary to transfer the previously formed resin pattern.

[II] Photosensitive Dry Film

Subsequently, the photosensitive dry film of the present invention will be illustrated. The photosensitive dry film of the invention is provided between a support film and a protection film with a photosensitive resin composition layer formed from the photosensitive resin composition of the present invention. Upon the use thereof, the photosensitive resin layer may be easily provided on the material to be processed by peeling the protection film off from the photosensitive resin layer, overlaying the uncovered photosensitive resin layer on the material to be processed, and subsequently peeling the support film off from the photosensitive resin layer.

The layer formed with the dry film of the present invention may have better film thickness uniformity and surface smoothness than a photosensitive resin layer formed by directly applying the photosensitive resin composition to the material to be processed.

The support film used for the production of the photosensitive dry film of the present invention is not particularly limited as long as the film is a removable film from which the photosensitive resin layer formed thereon can be easily peeled off, and from which the layer may be easily transferred onto a face to be processed such as face of glass. Examples of the support film may include flexible films composed of synthetic resin such as polyethylene terephthalate, polyethylene, polypropylene, polycarbonate and polyvinyl chloride whose film thickness is 15 to 125 μm. It is preferable to give a mould releasing treatment to the above film so as to be easily transferred as needed.

The photosensitive resin layer may be formed on the support film by applying the prepared photosensitive resin composition of the present invention on the support film such that a dried film thickness is 10 to 100 μm using an applicator, a bar coater, a wire bar coater, a roll coater or a curtain flow coater. In particular, the roll coater is preferable in terms of excellent film thickness uniformity and efficient formation of thick films.

Although the photosensitive resin layer may be formed by directly applying the photosensitive resin composition of the present invention to the support film, the photosensitive resin layer may also be formed by previously forming a water soluble resin layer on the support film and then applying the photosensitive resin composition of the present invention to this water soluble resin layer. The water soluble resin layer prevents a desensitization of the photosensitive resin which may be caused by oxygen, as well as prevents tacky adhesion of a mask (pattern) closely fitted upon exposing the photosensitive layer to light. The water soluble resin layer may be formed by applying an aqueous solution of 5 to 20% by weight of a water soluble polymer such as polyvinyl alcohol or partially saponified polyvinyl acetate such that the dried film thickness is 1 to 10 μm using the bar coater, the roll coater or the curtain flow coater followed by drying. The aqueous solution of the water soluble polymer for forming this water soluble resin layer may preferably contain ethyleneglycol, propyleneglycol or polyethyleneglycol because the flexibility of the water soluble resin layer is increased and the releasing property from the flexible film is enhanced.

When the thickness of such a water soluble resin layer is less than 1 μm, inferior light exposure sometimes may occur due to oxygen desensitization whereas when the thickness is more than 10 μm, a resolution tends to be insufficient. The aqueous solution may contain, for example, methanol, ethyleneglycol monomethyl ether, acetone or a commercially available anti-foaming agent, considering the viscosity and anti-foaming in the solution.

As this protection film, a polyethylene terephthalate film, a polypropylene film and a polyethylene film having a thickness of about 15 to 125 μm coated or printed with silicone are suitable.

Subsequently, an example of the method for using the photosensitive dry film of the present invention will be illustrated. Firstly, the protection film is peeled off from the dry film. The uncovered photosensitive resin layer is then overlaid on the material to be processed. Then, a heat roller is moved on the support film, to heat-press the photosensitive resin layer on the surface of the material to be processed. Since the photosensitive resin layer contains the aforementioned carboxy-modified urethane (meth)acrylate compound, the layer very firmly adheres to the material to be processed.

If the material to be processed is a glass substrate, the heat-press may be performed at a roll pressure of 1 to 5 kg/cm$^2$ and a moving rate of 0.1 to 10.0 m/min by heating the surface of the glass substrate to a temperature at 80 to 140° C. The glass substrate may be preliminarily heated, and for example, preliminarily heated at the range of 40 to 100° C.

It is possible to reuse the protection film peeled off from the photosensitive dry film by sequentially rewinding up with a rewinding roller in a rolled shape and storing it.

Then, a mask having a predetermined mask pattern may be closely fitted, and ultraviolet light may then be exposed from thereabove using a lamp such as a low pressure mercury lamp, a high pressure mercury lamp, an ultra-high pressure mercury lamp, an arc lamp or a xenon lamp. As an alternative to the ultraviolet light, excimer laser, X-ray or electron beam may be irradiated. By the use of the photosensitive resin composition according to the present invention, the photosensitive resin layer which highly firmly adheres to the material to be processed and has an excellent sand blast proof property, sensitivity and working property may be obtained. After this light exposure, the mask and the support film may be removed, and the development may be performed.

A developer used for this development may be a commonly used alkali developer. Examples of an alkali ingredient used for the developer may include a hydroxide, a carbonate salt, a bicarbonate salt, a phosphate salt and a pyrophosphate salt of alkali metals such as lithium, sodium and potassium; primary amines such as benzylamine and butylamine; secondary amines such as dimethylamine, dibenzylamine and diethanolamine; tertiary amines such as trimethylamine, triethylamine and triethanolamine; cyclic amines such as morpholine, piperazine and pyridine; polyamines such as ethylenediamine and hexamethylenediamine; ammonium hydroxides such as tetraethylammonium hydroxide, trimethylbenzylammonium hydroxide and trimethylphenylbenzylammonium hydroxide; sulfonium hydroxides such as tirimethylsulfonium hydroxide, diethylmethylsulfonium hydroxide and dimethylbenzylsulfonium hydroxide; and additionally choline and a silicate salt containing buffer, and the like.

The photosensitive resin composition of the present invention is excellent in development property, and therefore, a precise resist pattern may be obtained even the pattern to be formed requires a high resolution.

Then, the sand blast processing may be performed using the resulting resist pattern as a masking material. The blast material for the sand blast processing may be those known publicly, and examples thereof may include fine particles of SiC, $SiO_2$, glass, $Al_2O_3$ and ZrO with a size of about 2 to 100 μm A product engraved along the line with the pattern may be completed by peeling the resist pattern off with an alkali aqueous solution after the sand blast processing. It is also possible to burn out the resin layer instead of peeling the resist pattern with the alkali aqueous solution.

The resist pattern formed using the photosensitive resin composition of the present invention has the excellent sand blast proof property, and therefore an engraving accuracy may be increased at the sand blast processing by the use of the resist pattern as the masking material.

EXAMPLES

The present invention will be illustrated in more detail with reference to the following Examples, but the present invention is not limited thereto.

Example 1

The following compounds were mixed at the specified ratio and stirred to prepare a photosensitive resin composition.

(A) Carboxy-modified Urethane (meth)acrylate Compound
SSUA-4 (supplied from Kyoeisha Chemical Co., Ltd., acid value: 4 mg KOH/g, glass transition point: −20° C., weight average molecular weight: 10,000, containing 30% ethyl acetate as a solvent) . . . 43 parts by weight (B) Alkali Soluble Polymer Compound
Solution of 40% by weight of an acrylic copolymer consisting of methacrylic acid/methyl methacrylate/butyl methacrylate at the ratio of 35/20/45 (weight average molecular weight: 70,000, acid value: 190 mg KOH/g) in methylethylketone . . . 100 parts by weight (C) Photopolymerization Initiator
2-(o-Chlorophenyl)-4,5-diphenylimidazolyl dimer . . . 4 parts by weight (D) Photopolymerizable Compound Containing Structural Units Represented by the Formula (I) in the Structure
2,2-Bis[4-(methacryloxypolyethoxy)phenyl]propane (NK ester BPE1300, supplied from Shin-Nakamura Chemical Co., Ltd., a total sum of the structural units represented by the formula (I) in the structure: 30) . . . 10 parts by weight (E) Other Polymerizable Monomer
Trimethylolpropane acrylate (M-309, supplied from Toagosei Co., Ltd.) . . . 5 parts by weight (F) Other Ingredients
Heat polymerization inhibitor : Q-1301 (supplied from Wako Pure Chemical Industries Ltd.) . . . 0.02 parts by weight
Dye: Diamond green (supplied from Hodogaya Chemical Co., Ltd.) . . . 0.02 parts by weight The resulting photosensitive resin composition was applied to a polyethylene terephthalate film (PET film) having a thickness of 25 μm using an applicator such that a film thickness after drying was 40 μm, and drying it, to form a photosensitive resin layer. Then, the photosensitive composition layer was covered with a polyethylene film having a thickness of 23 μm while the polyethylene film was pressed with a rubber roller to push bubbles out, to prepare a photosensitive film for the sand blast process.

The polyethylene film of this photosensitive film was peeled off, and the uncovered photosensitive composition layer was laminated on a surface of a glass substrate heated at 80° C. using the rubber roller. A mask having a test pattern was closely fitted, and subsequently ultraviolet light exposure was performed at an irradiation dose of 150 mJ/cm$^2$ from an ultra-high pressure mercury lamp. The polyethylene terephthalate film (PET film) was peeled off, and subsequently spray development was preformed by blowing an aqueous solution of 10% $Na_2CO_3$ at a spray pressure of $1.0\times10^5$ Pa (1.0 kgf/cm$^2$) for 30 seconds, to form a resist pattern.

The resulting resist pattern had a rectangular cross-section and a pattern with high accuracy.

Subsequently, to evaluate the sand blast proof property, the time until the photosensitive composition layer was worn away and lost by sand blast processing with a nozzle distance of 80 mm at a blast pressure of $1.0\times10^5$ Pa (1.0 kgf/cm$^2$) using an SUS type abrasive #800 was measured. As a result, the time was 120 seconds, which indicates a good sand blast proof property.

Example 2

A photosensitive film was made by the same operation as that in Example 1, except that the photopolymerizable compound (D) containing the structural units represented by the formula (I) in the structure used in Example 1 was changed to polyethyleneglycol diacrylate (NK ester A-600, supplied from Shin-Nakamura Chemical Co., Ltd., number of the structural units represented by the formula (I) in the structure: 14).

Then, a pattern was formed by the same operation as that in Example 1. The resulting resist pattern had a rectangular cross-section and a pattern with high accuracy. The sand blast proof property was evaluated by the same operation as that in Example 1. As a result, the time until the photosensitive composition layer was worn away and lost was 130 seconds, which indicates a good sand blast proof property.

Comparative Example 1

A photosensitive film was formed by the same operation as that in Example 1, except that the carboxy-modified urethane (meth)acrylate compound (A) used in Example 1 was changed to SSUA-2 (supplied from Kyoeisha Chemical Co., Ltd., acid value: 21.5 mg KOH/g, glass transition point: 5° C., weight average molecular weight: 10,000, containing 30% ethyl acetate as a solvent).

Then, a pattern was formed by the same operation as in Example 1. The resulting resist pattern had a rectangular cross-section and a pattern with high accuracy. The sand blast proof property was evaluated by the same operation as that in Example 1. The time until the photosensitive composition layer was worn away and lost was 80 seconds, and the sand blast proof property was inferior compared to Examples 1 and 2.

Comparative Example 2

A photosensitive film was made by the same operation as that in Example 1, except that the photopolymerizable compound (D) containing the structural units represented by the formula (I) in the structure used in Example 1 was changed to 2,2-bis[4-(methacryloxypolyethoxy)phenyl]propane (NK ester BPE100, supplied from Shin-Nakamura Chemical Co., Ltd., number of the structural units represented by the formula (I) in the structure: 2.6).

Then, a pattern was formed by the same operation as that in Example 1. On the resulting pattern, unexposed parts that should have been eliminated in a development step were not perfectly eliminated, and the pattern was distorted.

INDUSTRIAL APPLICABILITY

As in the above, the photosensitive resin composition of the present invention gives a dry film having an excellent development property and a resist pattern excellent in sand blast proof property, and thus may be suitably used as the masking material for the sand blast processing. The photosensitive resin composition and the photosensitive dry film of the present invention may be suitably utilized for the rib formation in a plasma display panel.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims along with their full scope of equivalents.

What is claimed is:

1. A photosensitive resin composition comprising a carboxy-modified urethane (meth)acrylate compound (A) having two or more (meth)acryloyl groups per molecule whose acid value is less than 10 mg KOH/g, an alkali soluble polymer compound (B), a photopolymerization initiator (C) and a photopolymerizable compound (D) containing structural units represented by the formula (I-1):

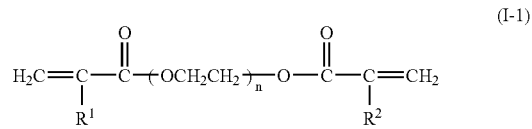

(I-1)

wherein $R^1$ and $R^2$ each independently represent H or a methyl group, and n is an integer of 10 to 40, and wherein the glass transition point of said carboxy-modified urethane (meth)acrylate compound (A) after being cured is −50° C. to 50° C.

2. The photosensitive resin composition according to claim 1 wherein said carboxy-modified urethane (meth)acrylate compound (A) is obtained by reacting an aliphatic polyisocyanate compound with a diol compound having a carboxyl group so that isocyanate groups remain at both ends thereof, and then reacting the terminal isocyanate groups of this reaction product with a (meth)acrylate compound having a hydroxyl group.

3. The photosensitive resin composition according to claim 1 wherein the weight ratio of the content of said carboxy-modified urethane (meth)acrylate compound (A) to the content of said alkali soluble polymer compound is in the range of 1:19 to 19:1.

4. A photosensitive dry film comprising a photosensitive resin composition layer formed from the photosensitive resin composition according to claim 1 between a support film and a protection film.

5. A photosensitive resin composition comprising a carboxy-modified urethane (meth)acrylate compound (A) having two or more (meth)acryloyl groups per molecule whose acid value is less than 10 mg KOH/g, an alkali soluble polymer compound (B), a photopolymerization initiator (C) and a photopolymerizable compound (D) containing structural units represented by the formula (I-2):

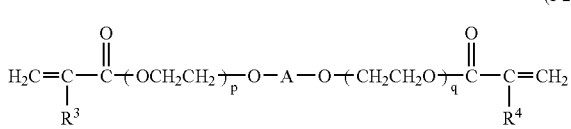
(I-2)

wherein $R^3$ and $R^4$ each independently represent H or a methyl group, A represents an aliphatic hydrocarbon group having 1 to 20 carbon atoms, an alicyclic hydrocarbon group having 3 to 20 carbon atoms, an aromatic hydrocarbon group having 6 to 20 carbon atoms, or a hydrocarbon group binding two or more of these substituents, and p and q are positive integers selected so that p+q is 10 to 40, and wherein the glass transition point of said carboxy-modified urethane (meth)acrylate compound (A) after being cured is −50° C. to 50° C.

6. The photosensitive resin composition according to claim 5 wherein said carboxy-modified urethane (meth)acrylate compound (A) is obtained by reacting an aliphatic polyisocyanate compound with a diol compound having a carboxyl group so that isocyanate groups remain at both ends thereof, and then reacting the terminal isocyanate groups of this reaction product with a (meth)acrylate compound having a hydroxyl group.

7. The photosensitive resin composition according to claim 5 wherein the weight ratio of the content of said carboxy-modified urethane (meth)acrylate compound (A) to the content of said alkali soluble polymer compound is in the range of 1:19 to 19:1.

8. A photosensitive dry film comprising a photosensitive resin composition layer formed from the photosensitive resin composition according to claim 5 between a support film and a protection film.

* * * * *